(12) United States Patent
Abuelma'atti et al.

(10) Patent No.: US 9,184,734 B1
(45) Date of Patent: Nov. 10, 2015

(54) VOLTAGE OR CURRENT CONTROLLED CURRENT-FEEDBACK OPERATIONAL-AMPLIFIER BASED MULTIVIBRATOR

(71) Applicant: King Fahd University of Petroleum and Minerals, Dhahran (SA)

(72) Inventors: Muhammad Taher Abuelma'atti, Dhahran (SA); Zainulabideen Jamal Khalifa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/532,094

(22) Filed: Nov. 4, 2014

(51) Int. Cl.
*H03K 7/06* (2006.01)
*H03K 4/52* (2006.01)
*H03K 3/0231* (2006.01)
*H03K 7/08* (2006.01)

(52) U.S. Cl.
CPC ............... *H03K 4/52* (2013.01); *H03K 3/0231* (2013.01); *H03K 7/08* (2013.01)

(58) Field of Classification Search
CPC .......... H03K 3/0231; H03K 7/08; H03K 4/52
USPC ........ 327/172, 100, 101, 50, 51, 54; 331/111, 331/143, 113 R, 74
See application file for complete search history.

(56) References Cited

U.S. PATENT DOCUMENTS

| 4,336,508 A | 6/1982 | Cole et al. |
| 6,633,203 B1 * | 10/2003 | Joe ..................... H03K 5/00006 331/111 |
| 7,196,482 B2 | 3/2007 | Krieger et al. |
| 8,188,773 B1 * | 5/2012 | Abuelma'atti ......... H03K 4/501 327/134 |
| 8,860,518 B1 * | 10/2014 | Abuelma'atti ....... H03K 3/0231 331/111 |

FOREIGN PATENT DOCUMENTS

JP          2010-74811 A    4/2014

* cited by examiner

*Primary Examiner* — Arnold Kinkead
(74) *Attorney, Agent, or Firm* — Oblon, McClelland, Maier & Neustadt, L.L.P.

(57) ABSTRACT

A voltage or current controlled current-feedback operational-amplifier based multivibrator provides oscillation based on two current feedback operational amplifiers, three resistors and one grounded capacitor. The multivibrator can achieve almost constant frequency of oscillation and its duty cycle can be adjusted by a control voltage or a control current. The multivibrator can be used for generating pulse-width modulated signals.

9 Claims, 4 Drawing Sheets

VOLTAGE OR CURRENT CONTROLLED CURRENT-FEEDBACK OPERATIONAL-AMPLIFIER BASED MULTIVIBRATOR

TECHNICAL FIELD

The exemplary embodiments described herein are related to the field of multivibrator circuits.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Multivibrators are widely used in instrumentation, measurements, control and communication systems. Over the years researchers have developed mutivibrator circuits built around different active elements; for example an operational amplifier (OA), an operational transconductance amplifier (OTA), a plus-type second-generation current-conveyor (CCII+), a operational transresistance amplifier (OTRA) and a current feedback operational amplifier (CFOA).

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

In one embodiment, there is provided a voltage or current controlled current-feedback operational-amplifier based multivibrator, including: a first current-feedback operational amplifier having a first input terminal, a second input terminal directly coupled to a voltage control input, and a first output terminal, a second current-feedback operational amplifier having a third input terminal directly coupled to the first output terminal of the first current-feedback operational amplifier, a fourth input terminal, a second output terminal directly coupled to a output terminal of the multivibrator, and a third output terminal, a first resistor connected between the first input terminal of the first current-feedback operational amplifier and a ground, a second resistor connected between the first output terminal of the first current-feedback operational amplifier and a first node, a non-floating capacitor connected between a second node and the ground, wherein the second node is directly connected to the first node, a third resistor coupled connected the fourth input terminal of the second current-feedback operational amplifier and ground, and a fourth resistor coupled between the fourth input terminal and the third output terminal of the second current-feedback operational amplifier.

In another embodiment, the multivibrator further includes a variable voltage source coupled to the voltage control input to generate a constant oscillation frequency with a plurality of duty cycles at the second output terminal.

In another embodiment, a voltage from the variable voltage source is set to obtain a 50% duty cycle.

In another embodiment, the multivibrator further comprising a variable current source directly connected to the first input terminal of the first current-feedback operational amplifier to generate a constant oscillation frequency with a plurality of duty cycles at the second output terminal.

In another embodiment, a current from the variable current source is set to obtain a 50% duty cycle.

In another embodiment, the non-floating capacitor consists of a single capacitor directly connected to the ground.

In another embodiment, a rising time of an oscillation of a waveform generated by the multivibrator is described by:

$$T_1 = CR_X \ln\left(\frac{(R_1 V_{sat+} - (R_1 - R_X)V_{sat-} + (R_1 + R_2)R_X V_{control}/R}{R_1 V_{sat+} - (R_1 - R_X)V_{sat+} + (R_1 + R_2)R_X V_{control}/R}\right)$$

wherein R is a resistance of the first resistor, $R_X$ is a resistance of the second resistor, $R_1$ is a resistance of the third resistor, $R_2$ is a resistance of the fourth resistor, C is a capacitance of the first capacitor, $V_{control}$ is a voltage applied to the voltage control input of the multivibrator, $V_{sat+}$ is a maximum output voltage of the output terminal of the multivibrator, and $V_{sat-}$ is a minimum output voltage of the output terminal of the multivibrator.

In another embodiment, a falling time of an oscillation of a waveform generated by the multivibrator is described by:

$$T_2 = CR_X \ln\left(\frac{(R_1 V_{sat-} - (R_1 - R_X)V_{sat+} + (R_1 + R_2)R_X V_{control}/R}{R_1 V_{sat-} - (R_1 - R_X)V_{sat-} + (R_1 + R_2)R_X V_{control}/R}\right)$$

wherein R is a resistance of the first resistor, $R_X$ is a resistance of the second resistor, $R_1$ is a resistance of the third resistor, $R_2$ is a resistance of the fourth resistor, C is a capacitance of the first capacitor, $V_{control}$ is a voltage applied to the voltage control input terminal of the multivibrator, $V_{sat+}$ is a maximum output voltage of the output terminal of the multivibrator, and $V_{sat-}$ is a minimum output voltage of the output terminal of the multivibrator.

In another embodiment, an oscillation period of a waveform generated by the multivibrator is described by:

$$T = T_1 + T_2 = \frac{1}{f} = CR_X \ln\left(\frac{\left(\frac{V_{control}}{R}R_X(R_1+R_2)\right)^2 - (V_{sat}(2R_1 - R_X))^2}{\left(\frac{V_{control}}{R}R_X(R_1+R_2)\right)^2 - (V_{sat}R_X)^2}\right)$$

wherein R is a resistance of the first resistor, $R_X$ is a resistance of the second resistor, $R_1$ is a resistance of the third resistor, $R_2$ is a resistance of the fourth resistor, C is a capacitance of the first capacitor, $V_{control}$ is a voltage applied to the voltage control input of the multivibrator, $V_{sat-}=-V_{sat+}=-V_{sat}$, $V_{sat+}$ is a maximum output voltage of the output terminal of the multivibrator, and $V_{sat-}$ is a minimum output voltage of the output terminal of the multivibrator.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
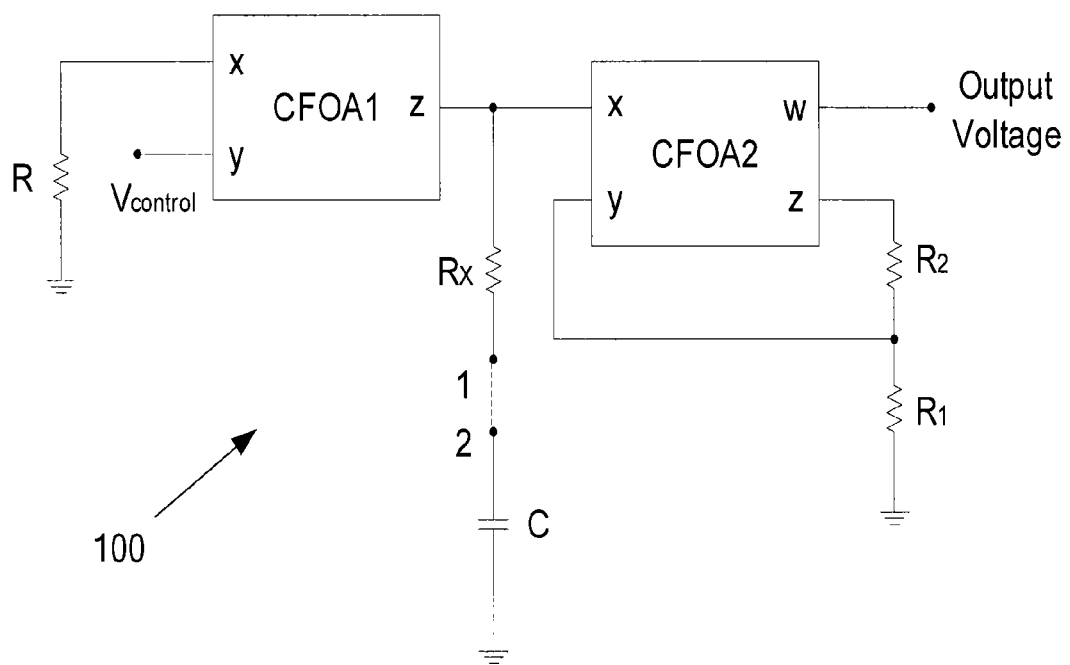
FIG. 1 is an exemplary circuit schematic of a voltage controlled multivibrator.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "about," and similar terms generally refer to ranges that include the identified value within a margin of 20%, 10%, or preferably 5%, and any values therebetween.

Referring now to the drawings, wherein like reference numerals designate identical or corresponding parts throughout the several views.

Multivibrators have a wide application in various control and communication systems.

However, inspection of the available circuits shows that each circuit suffers from one or more of the following drawbacks as recognized by the present inventor:

References such as, W. S. Chung, H. Kim, H. W. Cha and H. J. Kim, (Triangular/square-wave generator with independently controllable frequency and amplitude, IEEE Transactions on Instrumentation and Measurement, Vol. 54, 2005, pp. 105-109—incorporated herein by reference), where three OTAs are used, and R. Stoner, J. Jerabek, N. Herencsar, A. Lahiri, J. Petrzela and K. Vrba, (Practical aspects of operation of simple triangular and square wave generator employing diamond transistor and controllable amplifiers, Proceedings of the 36th International Conference on Telecommunications and Signal Processing, 2013, pp. 431-435—incorporated herein by reference) where two voltage controlled amplifiers and one diamond transistor are used, show great complexity. The present inventor recognized that these circuits are more complex and use more components than less complex circuits that provide suitable performance.

References such as, M. Janecek, D. Kubanek and K. Vrba, (Voltage-controlled square/triangular wave generator with current conveyors and switching diodes, International Journal of Advances in Telecommunications Electrotechnics, Signals and Systems, Vol. 1, No. 2-3, 2012, DOI: 10.11601/ijates.v1i2-3.33—incorporated herein by reference) where the Universal Current Conveyor (UCC) is used, D. Biolek and V. Biolkova, (Current-mode CDTA-based comparators, Proceedings of the 13th International Conference on Electronic Devices and Systems, 2006, pp. 6-10—incorporated herein by reference) where the current-differencing transconductance amplifier (CDTA) is used, H.-C. Chien, (Voltage-controlled dual slope operation square/triangular wave generator and its application as a dual mode operation pulse width modulator employing differential voltage current conveyors, Microelectronics Journal, Vol. 43, 2012, pp. 962-974—incorporated herein by reference) and S. Minaei and E. Yuce, (A simple Schmitt trigger circuit with grounded passive elements and its application to square/triangular wave generator, Circuits, Systems and Signal Processing, Vol. 31, 2012, pp. 877-888,—incorporated herein by reference) where differential voltage current conveyor (DVCC) is used, C. L. Hou, H. C. Chien and Y. K. Lo, (Squarewave generators employing OTRAs, IEE Proceedings Circuits, Devices and Systems, Vol. 152, 2005, pp. 718-722—incorporated herein by reference) and Y. K. Lo and H. C. Chien, (Switch-controllable OTRA-based square/triangular waveform generator, IEEE Transaction on Circuits and Systems and Signal Processing II, Vol. 54, 2007, ppp. 1110-1114—incorporated herein by reference) where OTRA is used, J. Kumbun and M. Siripruchyanun, (MO-CTTA-based electronically controllable current-mode square/triangular wave generator, Proceedings of the 1st International Conference On Technical Education, 2010, pp. 158-162—incorporated herein by reference) where a MO-CTTA is used and P. Silapan, M. Siripruchyanun, (Fully and electronically controllable current-mode Schmitt triggers employing only single MO-CCCDTA and their applications, Analog Integrated Circuits and Signal Processing, Vol. 68, 2011, pp. 111-128—incorporated herein by reference) and (T. Srisakul, P. Silapan and M. Siripruchyanun, An electronically controlled current-mode triangular/square wave generator employing MO-CCCDTAs, Proceedings of the 8th International Conference on Electrical Engineering/Electronics, Computer, Telecommunications and Information Technology, 2011, pp. 82-85—incorporated herein by reference) where a MO-CCCDTA is used, are using commercially unavailable integrated circuits, thus, limiting the adoption by a broad user group.

References such as, D. Biolek and V. Biolkova, (Current-mode CDTA-based comparators, Proceedings of the 13th International Conference on Electronic Devices and Systems, 2006, pp. 6-10—incorporated herein by reference), S. Minaei and E. Yuce, A simple Schmitt trigger circuit with grounded passive elements and its application to square/triangular wave generator, Circuits, Systems and Signal Processing, Vol. 31, 2012, pp. 877-888—incorporated herein by reference), C. L. Hou, H. C. Chien and Y. K. Lo, (Squarewave generators employing OTRAs, IEE Proceedings Circuits, Devices and Systems, Vol. 152, 2005, pp. 718-722—incorporated herein by reference) A. S. Hague, M. M. Hossain, W. A. Davis, H. T. Russell Jr. and R. L. Carter, (Design of sinusoidal, triangular, and square wave generator using current feedback operational amplifier (CFOA), Proceedings of the IEEE Region 5 Conference, 2008, pp. 1-5—incorporated herein by reference) A. De Mercellis, C. Di Carlo, G. Ferri and V. Stornelli, (A CCII-based wide frequency range square waveform generator, International Journal of Circuit Theory and Applications, Vol. 41, 2013, pp. 1-13—incorporated herein by reference), D. Pal, A. Srinivasulu B. B. Pal, Demosthenous and B. N. Das, (Current conveyor-based square/triangular waveform generators with improved linearity, IEEE Transactions on Instrumentation and Measurement, Vol. 58, 2009, pp. 2174-2180—incorporated herein by reference), B. Almashary and H. Alhokail, (Current-mode triangular wave generator using CCIIs, Microelectronics Journal, Vol. 31, 2000, pp. 239-243-incorporated herein by reference) are useful structures, but lack electronic controls.

References such as, C. L. Hou, H. C. Chien and Y. K. Lo, (Squarewave generators employing OTRAs, IEE Proceedings Circuits, Devices and Systems, Vol. 152, 2005, pp. 718-722—incorporated herein by reference), A. S. Hague, M. M. Hossain, W. A. Davis, H. T. Russell Jr. and R. L. Carter, (Design of sinusoidal, triangular, and square wave generator using current feedback operational amplifier (CFOA), Proceedings of the IEEE Region 5 Conference, 2008, pp. 1-5—incorporated herein by reference), A. De Mercellis, C. Di Carlo, G. Ferri and V. Stornelli, (A CCII-based wide frequency range square waveform generator, International Journal of Circuit Theory and Applications, Vol. 41, 2013, pp. 1-13—incorporated herein by reference), D. Pal, A. Srinivasulu B. B. Pal, Demosthenous and B. N. Das, (Current conveyor-based square/triangular waveform generators with improved linearity, IEEE Transactions on Instrumentation and Measurement, Vol. 58, 2009, pp. 2174-2180—incorporated herein by reference), B. Almashary and H. Alhokail, (Current-mode triangular wave generator using CCIIs, Microelectronics Journal, Vol. 31, 2000, pp. 239-243—incorporated herein by reference), use a floating capacitor, which, as recognized by the present inventor, can limit accurate control, and is difficult to be integrated in an integrated circuit.

References such as, A. S. Sedra and K. C. Smith, (Microelectronic Circuits, Oxford University, 2004—incorporated herein by reference) restrict frequency of operation due to the use of operational amplifiers and need additional circuits to provide low output impedance voltage.

The presently disclosed embodiment presents an electronically voltage/current controlled multivibrator circuit that avoids the issues in conventional devices as discussed above. It is built around the CFOA and avoids the use of floating capacitors; thus, it can work at relatively high frequencies, be reliably fabricated in an integrated circuit, and provide a low impedance output voltage.

FIG. 1 shows an exemplary astable multivibrator 100. It includes two CFOAs, four resistors and one capacitor. A resistor R is connected between an input x terminal of a CFOA1 and a ground node. A controllable voltage $V_{control}$ is connected to an input y terminal of the CFOA1. An output z of the CFOA1 is connected to an input x terminal of a CFOA2. A resistor Rx is connected between the output z terminal of the CFOA1 and a node 1. A non-floating capacitor is connected between a node 2 and the ground node. A resistor R2 is connected between an input y terminal and an output z terminal of the CFOA2 and a resistor R1 is connected between the input y and ground node. The CFOA1 serves as a voltage-to-current converter. By applying the control voltage $V_{control}$ to the input y terminal, the CFOA1 converts the $V_{control}$ to a current, and feed the current to the input x terminal of the CFOA2. The CFOA2 operates as an astable multivibrator which oscillates and gives a square-wave output. The resistance Rx is an externally connected resistance with Rx>>R where R is a parasitic internal resistance at terminal x of the CFOA1.

Figure 2:
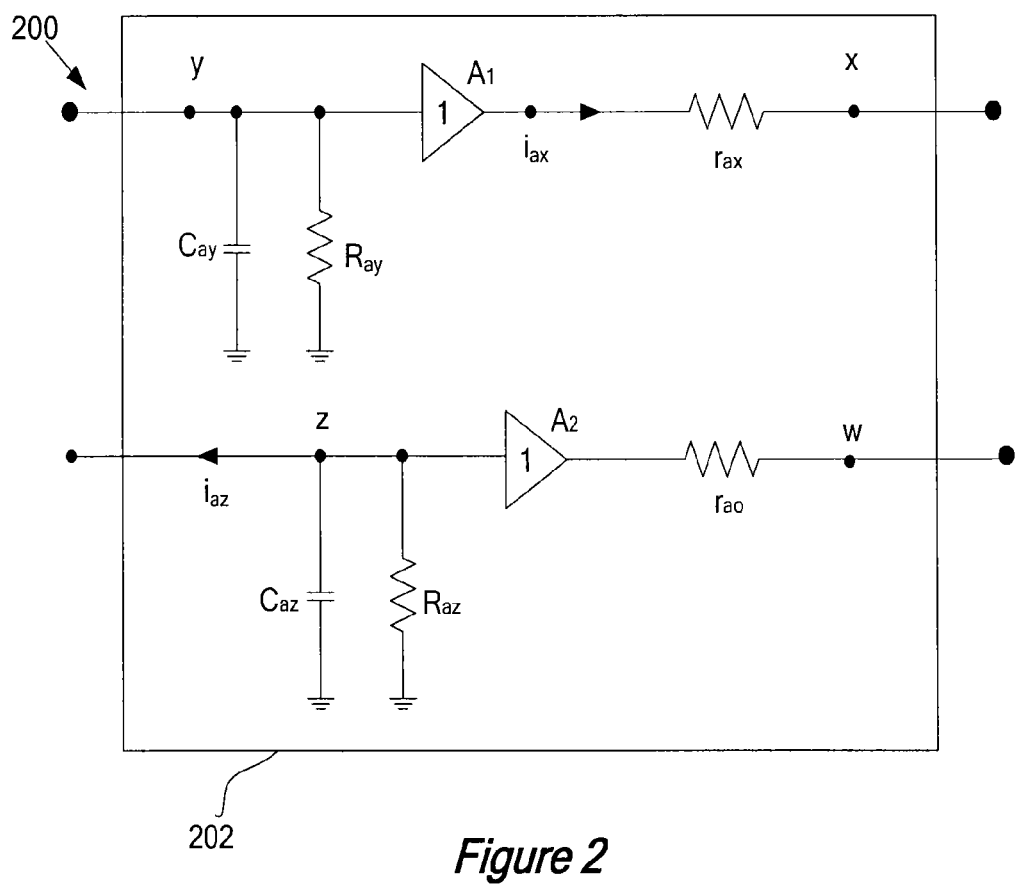
FIG. 2 is a schematic diagram of an equivalent circuit of the current-feedback operational amplifier-based sinusoidal oscillator according to the present embodiment.

In FIG. 2, a package 202 includes therein a simplified equivalent circuit for the CFOA 200. In this equivalent circuit, $r_{ax}$ and $r_{ao}$ represent output resistances of the unity-gain buffers A1 and A2, respectively; $C_{az}$ is an internally connected compensation capacitor; $R_{az}$ is an internal resistance of the gain node; $C_{ay}$ and $R_{ay}$ represent input impedances at the terminal y of the CFOA; and $i_{az}=i_{ax}$. The output terminal w of the CFOA 200 can be either connected or open.

For the multivibrator 100 shown in FIG. 1, the Rx is employed for charging and discharging of the capacitor C. The switching between charging and discharging states depends on a voltage value at the x terminal of the CFOA2, compared with a voltage value at the y-terminal of the CFOA2. The voltage value at the x terminal of CFOA2 is determined by the charge and discharge behavior of the capacitor C through the resistor Rx. The output voltage $V_0$ will switch between its maximum, $V_{sat+}$, and minimum, $V_{sat+}$, when the voltage at node 1, $V_1$, reaches the following two threshold voltage:

$$V_{th+} = \frac{R_1 - R_X}{R_1 + R_2}V_{sat+} - \frac{R_X}{R}V_{control} \quad (1)$$

$$V_{th-} = \frac{R_1 - R_X}{R_1 + R_2}V_{sat-} - \frac{R_X}{R}V_{control} \quad (2)$$

The threshold voltage can be controlled by the control voltage $V_{control}$ based on equations (1) and (2). In FIG. 1, the node 1 and the node 2 are connected through a dotted line, which means in normal operating conditions, the nodes 1 and 2 are always directly connected. Assume that the capacitor C in FIG. 1 has an initial voltage=$V_{th-}$, and is charging through the resistance $R_X$ heading towards:

$$V_a = \frac{R_1}{R_1 + R_2}V_{sat+} \quad (3)$$

The voltage across the capacitor can, therefore, be described as $$V_C(t)=V_a-(V_a-V_{th-})\exp(-t/CR_X) \quad (4)$$

The capacitor will continue charging until its voltage reaches $V_{th+}$ when the output voltage of the CFOA2 switches to $V_{sat-}$ and the process will be reversed. Using equation (4), the time $T_1$ required to charge the capacitor from $V_{th-}$ to $V_{th+}$ is given by $$T_1 = CR_X \ln\left(\frac{V_a - V_{th-}}{V_a - V_{th+}}\right) \quad (5)$$

When the capacitor voltage reaches $V_{th+}$ the output voltage of the CFOA2 switches to $V_{sat-}$ and the capacitor starts a charging process heading towards $V_b$, wherein the $V_b$ is defined as:

$$V_b = \frac{R_1}{R_1 + R_2}V_{sat-} \quad (6)$$

The voltage across the capacitor C can, therefore, be described as $$V_C(t)=V_b-(V_b-V_{th+})\exp(-t/CR_X) \quad (7)$$

The capacitor C is directly connected to the ground node in one terminal; therefore, it is a ground capacitor, which is ideal for integrated circuit implementation. The capacitor will continue charging until its voltage reaches $V_{th-}$ when the output voltage of the CFOA switches to $V_{sat+}$ and the process will be reversed. Using equation (7), the time $T_2$ required to charge the capacitor from $V_{th+}$ to $V_{th-}$ will be given by $$T_2 = CR_X \ln\left(\frac{V_b - V_{th+}}{V_b - V_{th-}}\right) \quad (8)$$

When the voltage across the capacitor reaches $V_{th-}$ the output voltage of the CFOA2 switches to $V_{sat+}$ and the process will be repeated. Combining equations (1), (2), (3), (5) yields $$T_1 = CR_X \ln\left(\frac{(R_1 V_{sat+} - (R_1 - R_X)V_{sat-} + (R_1 + R_2)R_X V_{control}/R}{R_1 V_{sat+} - (R_1 - R_X)V_{sat+} + (R_1 + R_2)R_X V_{control}/R}\right) \quad (9)$$

Similarly, combining equations (1), (2), (6), (8) yields $$T_2 = CR_X \ln\left(\frac{(R_1 V_{sat-} - (R_1 - R_X)V_{sat+} + (R_1 + R_2)R_X V_{control}/R}{R_1 V_{sat-} - (R_1 - R_X)V_{sat-} + (R_1 + R_2)R_X V_{control}/R}\right) \quad (10)$$

Based on equations (9) and (10), $T_1$ and $T_2$ are not equal. Thus, the duty cycle, defined as $D=T_1/(T_1+T_2)$, of the resulting waveform will not be 50%. However, by adjusting the control voltage $V_{control}$ it is possible to obtain a 50% duty cycle.

Combining equations (9) and (10) and assuming that $V_{sat-}=-V_{sat+}=-V_{sat}$, yields $$T = \qquad (11)$$

$$T_1 + T_2 = \frac{1}{f} = CR_X \ln\left(\frac{\left(\frac{V_{control}}{R}R_X(R_1+R_2)\right)^2 - (V_{sat}(2R_1-R_X))^2}{\left(\frac{V_{control}}{R}R_X(R_1+R_2)\right)^2 - (V_{sat}R_X)^2}\right)$$

With $V_{control}=0$ equation (11) reduces to $$T = T_1 + T_2 = \frac{1}{f} = 2CR_X \ln\left(\frac{2R_1}{R_X} - 1\right) \quad (12)$$

According to equation (12), the resistor $R_1$ can be replaced by a junction field effect transistor (JFET) to control the frequency of oscillation via an external voltage. However, Equation (11) shows that the frequency of oscillation of the proposed multivibrator of FIG. 1 can be controlled by adjusting the control voltage $V_{control}$. Moreover, by replacing $$\frac{V_{control}}{R}$$

by a control current directly connected to terminal x of CFOA1, then the frequency of oscillation can also be controlled by the control current.

The disclosed circuit of FIG. 1 was tested using the AD844 CFOA as shown in FIG. 2. The results are obtained with C=10 nF, $R_X$=47 kΩ, $R_1$=8.7 kΩ, $R_2$=41.3 kΩ and R=47 kΩ.

Figure 3:
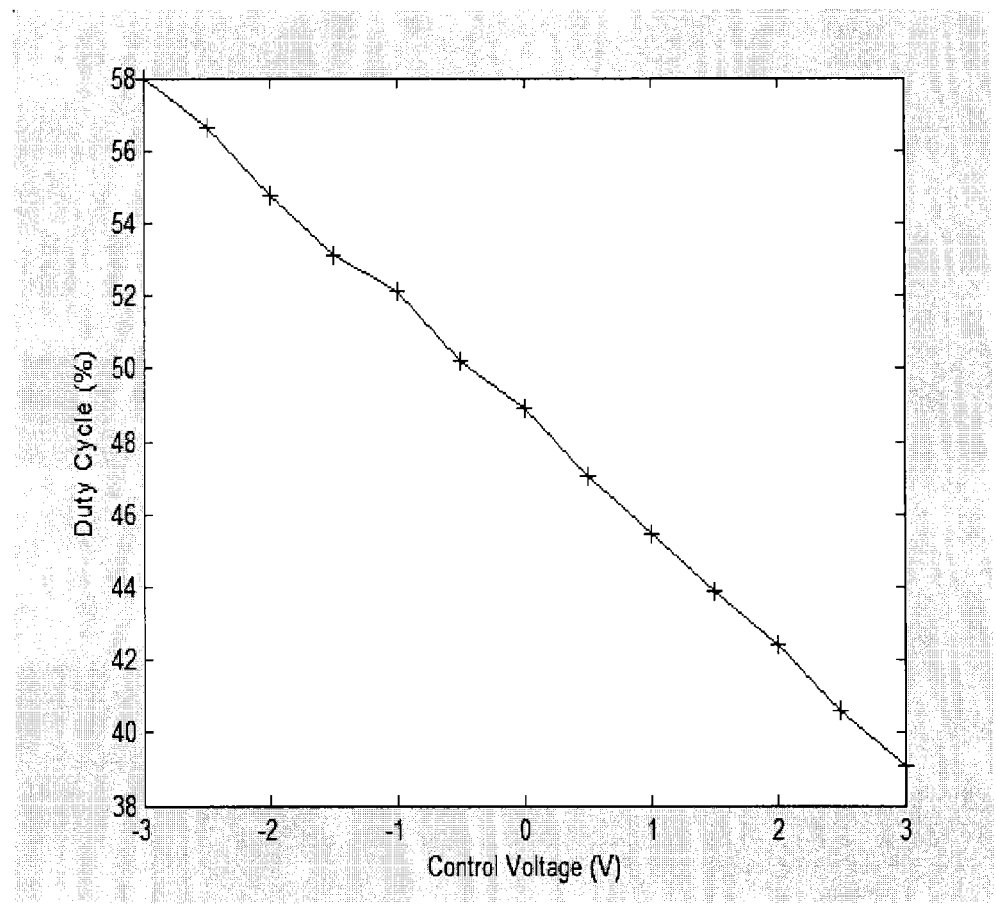
FIG. 3 is a graph that shows a variation of a duty cycle of an output waveform with a control voltage $V_{control}$ of the voltage controlled multivibrator.

FIG. 3 shows that the duty cycle can be controlled by the control voltage $V_{control}$. The x-axis is the adjustable input voltage $V_{control}$, and the y-axis is the duty cycle of the multivibrator. The duty cycle is defined as the ratio between a pulse duration and a period of a rectangular waveform. By varying the input voltage $V_{control}$ from −3V to +3V, the duty cycle of multivibrator increase from 38% to 58%. Also it is clear that a duty cycle of 50% can be obtained at a control voltage $V_{control} \cong -0.5V$.

Figure 4:
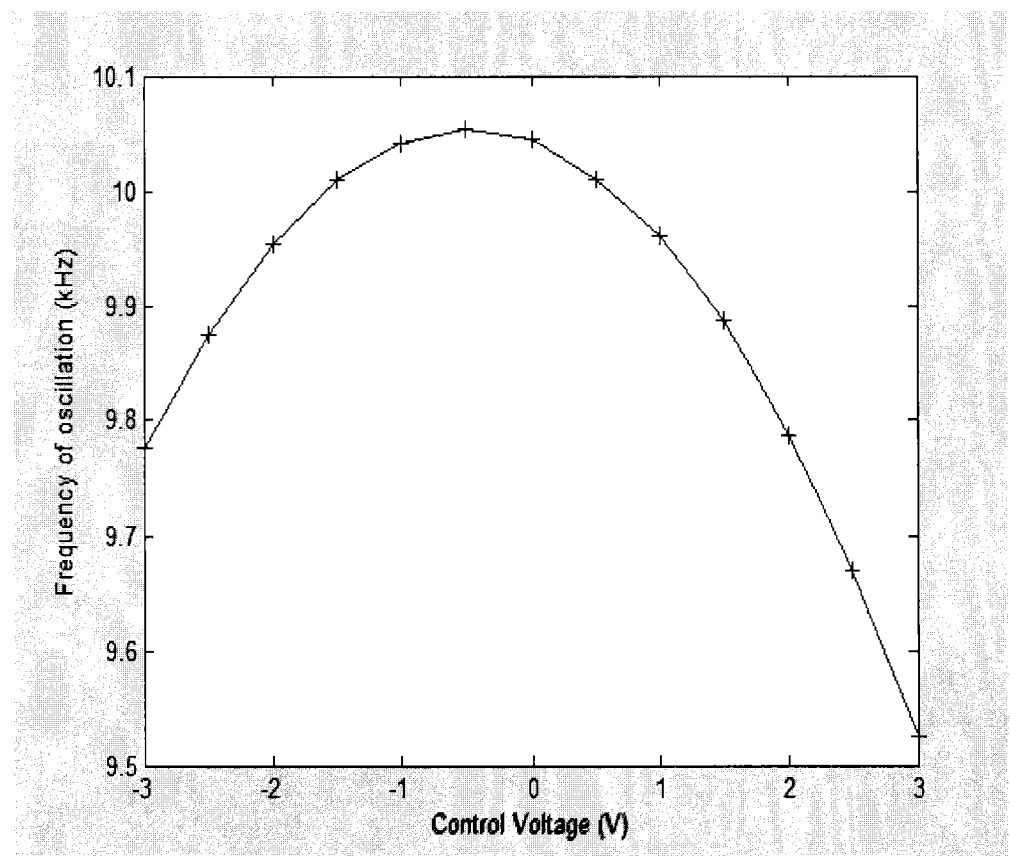
FIG. 4 is a graph that shows a variation of frequency oscillation of the output waveform with the control voltage $V_{control}$.

FIG. 4 shows that the frequency of oscillation of the output waveform is between 9.5 kHz and 10.1 kHz, which is almost constant, for the input control voltage $V_{control}$ in the range between −3V and +3V. The x-axis is the adjustable input voltage $V_{control}$, and the y-axis is the oscillation frequency of the multivibrator. The disclosed circuit generates an oscillation at a certain frequency with tunable duty cycles. Therefore, the multivibratior circuit can be used as a generator for pulse-width modulated waves.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A voltage or current controlled current-feedback operational-amplifier based multivibrator, comprising:
    a first current-feedback operational amplifier having
        a first input terminal,
        a second input terminal directly coupled to a voltage control input, and
        a first output terminal,
    a second current-feedback operational amplifier having
        a third input terminal directly coupled to the first output terminal of the first current-feedback operational amplifier,
        a fourth input terminal,
        a second output terminal directly coupled to a output terminal of the multivibrator, and
        a third output terminal,
    a first resistor connected between the first input terminal of the first current-feedback operational amplifier and a ground,
    a second resistor connected between the first output terminal of the first current-feedback operational amplifier and a first node,
    a non-floating capacitor connected between a second node and the ground, wherein the second node is directly connected to the first node,
    a third resistor coupled connected the fourth input terminal of the second current-feedback operational amplifier and ground, and
    a fourth resistor coupled between the fourth input terminal and the third output terminal of the second current-feedback operational amplifier.

2. The multivibrator of claim 1, further comprising a variable voltage source coupled to the voltage control input to generate a constant oscillation frequency with a plurality of duty cycles at the second output terminal.

3. The multivibrator of claim 2, wherein a voltage from the variable voltage source is set to obtain a 50% duty cycle.

4. The multivibrator of claim 1, further comprising a variable current source directly connected to the first input terminal of the first current-feedback operational amplifier to generate a constant oscillation frequency with a plurality of duty cycles at the second output terminal.

5. The multivibrator of claim 2, wherein a current from the variable current source is set to obtain a 50% duty cycle.

6. The multivibrator of claim 1, wherein the non-floating capacitor consists of a single capacitor directly connected to the ground.

7. The multivibrator of claim 1, wherein a rising time of an oscillation of a waveform generated by the multivibrator is described by:

$$T_1 = CR_X \ln\left(\frac{(R_1 V_{sat+} - (R_1 - R_X)V_{sat-} + (R_1 + R_2)R_X V_{control}/R}{R_1 V_{sat+} - (R_1 - R_X)V_{sat+} + (R_1 + R_2)R_X V_{control}/R}\right)$$

wherein R is a resistance of the first resistor, $R_X$ is a resistance of the second resistor, $R_1$ is a resistance of the third resistor, $R_2$ is a resistance of the fourth resistor, C is a capacitance of the first capacitor, $V_{control}$ is a voltage applied to the voltage control input of the multivibrator, $V_{sat+}$ is a maximum output voltage of the output terminal of the multivibrator, and $V_{sat-}$ is a minimum output voltage of the output terminal of the multivibrator.

8. The multivibrator of claim 1, wherein a falling time of an oscillation of a waveform generated by the multivibrator is described by:

$$T_2 = CR_X \ln\left(\frac{R_1 V_{sat-} - (R_1 - R_X)V_{sat+} + (R_1 + R_2)R_X V_{control}/R}{R_1 V_{sat-} - (R_1 - R_X)V_{sat-} + (R_1 + R_2)R_X V_{control}/R}\right)$$

wherein R is a resistance of the first resistor, $R_X$ is a resistance of the second resistor, $R_1$ is a resistance of the third resistor, $R_2$ is a resistance of the fourth resistor, C is a capacitance of the first capacitor, $V_{control}$ is a voltage applied to the voltage control input terminal of the multivibrator, $V_{sat+}$ is a maximum output voltage of the output terminal of the multivibrator, and $V_{sat-}$ is a minimum output voltage of the output terminal of the multivibrator.

9. The multivibrator of claim 1, where an oscillation period of a waveform generated by the multivibrator is described by:

$$T = T_1 + T_2 = \frac{1}{f} = CR_X \ln\left(\frac{\left(\frac{V_{control}}{R}R_X(R_1 + R_2)\right)^2 - (V_{sat}(2R_1 - R_X))^2}{\left(\frac{V_{control}}{R}R_X(R_1 + R_2)\right)^2 - (V_{sat}R_X)^2}\right)$$

wherein R is a resistance of the first resistor, $R_X$ is a resistance of the second resistor, $R_1$ is a resistance of the third resistor, $R_2$ is a resistance of the fourth resistor, C is a capacitance of is the first capacitor, $V_{control}$ is a voltage applied to the voltage control input of the multivibrator, $V_{sat-}=-V_{sat+}=-V_{sat}$, $V_{sat+}$ is a maximum output voltage of the output terminal of the multivibrator, and $V_{sat-}$ is a minimum output voltage of the output terminal of the multivibrator.

* * * * *